US008847629B2

(12) United States Patent
Landoulsi et al.

(10) Patent No.: US 8,847,629 B2
(45) Date of Patent: Sep. 30, 2014

(54) ELECTRONIC DEVICE AND METHOD FOR LOW LEAKAGE SWITCHING

(71) Applicant: Texas Instruments Deutschland GmbH, Freising (DE)

(72) Inventors: Aymen Landoulsi, Reutlingen Bayern (DE); Matthias Arnold, Friesing (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/861,738

(22) Filed: Apr. 12, 2013

(65) Prior Publication Data

US 2013/0271185 A1 Oct. 17, 2013

(30) Foreign Application Priority Data

Apr. 12, 2012 (EP) .................................... 12002585

(51) Int. Cl.
*G11C 27/02* (2006.01)
*H03K 17/16* (2006.01)

(52) U.S. Cl.
CPC .............. *H03K 17/16* (2013.01); *G11C 27/026* (2013.01); *G11C 27/024* (2013.01)
USPC ............................................. 327/94; 327/91

(58) Field of Classification Search
CPC ..... G11C 27/02; G11C 27/024; G11C 27/026
USPC .................................................... 327/91, 94
See application file for complete search history.

(56) References Cited

U.S. PATENT DOCUMENTS

| 5,422,583 | A * | 6/1995 | Blake et al. | 327/94 |
| 5,481,212 | A * | 1/1996 | Shima | 327/94 |
| 6,265,911 | B1 * | 7/2001 | Nairn | 327/94 |
| 6,603,295 | B2 * | 8/2003 | Reithmaier et al. | 323/313 |
| 8,049,555 | B2 * | 11/2011 | Arnold et al. | 327/542 |
| 2010/0201433 | A1 * | 8/2010 | Arnold et al. | 327/524 |

FOREIGN PATENT DOCUMENTS

DE 102009008757 * 12/2010

* cited by examiner

*Primary Examiner* — Ryan Jager
(74) *Attorney, Agent, or Firm* — John R. Pessetto; Frederick J. Telecky, Jr.

(57) ABSTRACT

The invention relates to a low leakage switch having an input node for receiving an input voltage and an output node for providing an output voltage. The low leakage switch comprises a main sampling transistor the backgate voltage of which is biased through other transistors, and wherein the control gate of the main sampling transistor is controlled through a second control signal and the control gates of the other transistors are controlled through a first control signal, wherein the electronic device is further configured to activate the other transistor for adjusting the backgate voltage of the main sampling transistor through the first control signal before activating the main sampling transistor for sampling the input voltage on a main sampling capacitor through the second control signal.

2 Claims, 8 Drawing Sheets

ELECTRONIC DEVICE AND METHOD FOR LOW LEAKAGE SWITCHING

This application claims priority to EPO Patent Application No. 12002585.3, filed on Apr. 12, 2012, incorporated herein by reference.

FIELD OF THE INVENTION

The invention relates to an electronic device and a method for low leakage switching, and more specifically to a low leakage switch for sampling an input voltage on a sampling capacitor. The invention also relates to an electronic device and a method for providing a reference current and/or a reference voltage using low leakage switches.

BACKGROUND

Low leakage switches are of importance in sample and hold systems with long hold times, as for example for reference current or reference voltage circuits. Especially, at elevated temperatures, leakage currents become an error source. Many electronic devices, as for example integrated semiconductor circuits, sample an input or reference voltage on a capacitor. One side of the sampling capacitor is coupled to an input voltage through a sampling switch. The sampling switch is closed (conducting) and the sampling capacitor is charged (sampling phase or sampling time). After having sampled the voltage on the sampling capacitor, the sampling switch is opened (not conducting).

One purpose of sampling a certain voltage level is to extend the time period (hold phase or hold time) during which the sampling switch is not conducting. This aims to preserve the sampled voltage on the sampling capacitor as long as possible which means that the charge on the sampling capacitor must be preserved. However, many characteristics of real integrated circuits adversely affect charge preservation. A drawback is the leakage current through the sampling switches. In a conventional approach it may be possible to overcome this effect merely by increasing the capacitance value of the sampling capacitor. However, this means increasing the size of the capacitor which is similar to increasing chip area and thereby costs of the integrated circuits. Larger capacitors can further increase power consumption if the same speed should be maintained as for smaller capacitors. Other solutions aim to improve the sampling switches.

Sampling switches are implemented with transistors. In a CMOS technology a switch may be an NMOS, a PMOS transistor or a combination of both referred to as a transmission gate. MOS transistors have P-doped regions and N-doped regions which can form parasitic diodes. One of these diodes is referred to as backgate diode as it couples the source or the drain of the transistor to the backgate being located opposite to the control gate. In a simplified model of a real MOS transistor a backgate diode may be located between drain and source of the transistor and the backgate. In order to avoid leakage currents through these backgate diodes, the voltage level on the backgate (or backgate) is controlled such that the backgate diodes are reversely biased. However, even with reverse bias a minimum saturation current can flow through the backgate diode and the voltage level on the sampling capacitor can change significantly.

Figure 1:
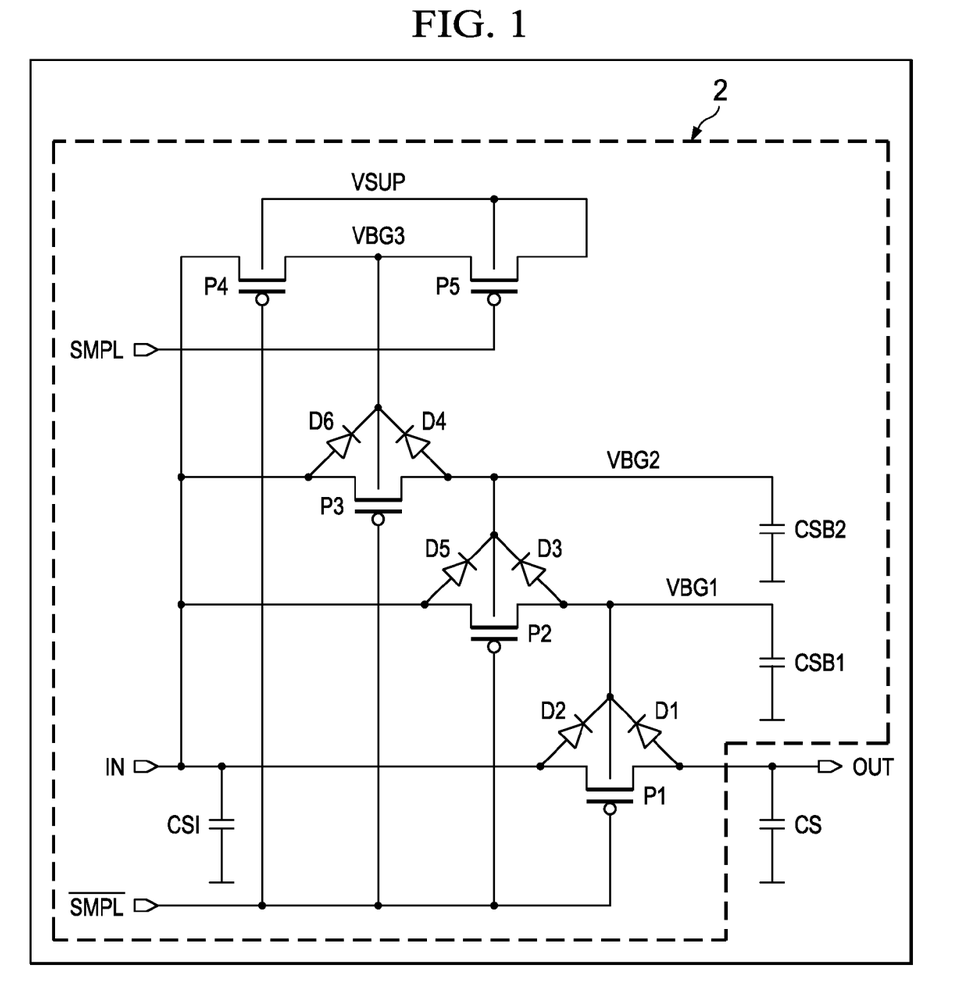
FIG. 1 shows a simplified circuit diagram of a low leakage (Prior Art)

FIG. 1 shows a simplified circuit diagram of a low leakage switch 2 according to the prior art and as disclosed in German patent 10 2009 008 757 of Texas Instruments. The switch 2 includes MOS transistors P1, P2 and P3. Each of the MOS transistors P1, P2 and P3 is coupled to an input node so as to receive the input voltage IN. The (control) gates are controlled with sampling clock signal $\overline{SMPL}$. The first transistor P1 of the cascade is coupled with its source/drain junction to the sampling capacitor CS. The second transistor P2 of the cascade is coupled with its source/drain junction to a first buffer capacitor CSB1 and to a backgate BG1 (bulk of P1) of the first transistor P1. The third transistor P3 of the cascade is coupled with its source/drain junction to the backgate BG2 of the second transistor P2 and with its own backgate BG3 to a tap node between transistors P4 and P5. P5 is configured to couple the backgate BG3 of the third transistor to supply voltage level VSUP during the hold phase. P4 is configured to couple the backgate BG3 of transistor P3 to the input voltage IN during the sampling phase. All transistors P1 to P3 of the cascade are simultaneously switched. Buffer capacitors CSB1 and CSP2 are provided and coupled to the backgates BG1 and BG2 of transistors P1 and P2. Only the backgate BG3 of the last transistor P3 of the cascade is either coupled to the input voltage during the sampling phase or to the supply voltage level during the hold phase. The input voltage is sampled on the sampling capacitor CS and also on the buffer capacitors CSB1 and CSB2.

During the sampling phase (SMPL=1, SMPL is logic high), transistors P1, P2, P3 and P4 are conducting and capacitors CS, CSB1 and CSB2 are charged to the input voltage level IN. Furthermore, the backgate BG3 of transistor P3 is coupled to the input voltage IN. The input voltage is also sampled and stored on the input capacitor CSI. This reduces channel leakage of P1, P2 and P3 reduces channel leakage from the capacitors CS, CSB1 and CSB2 to the input IN. During the hold phase (SMPL=0, SMPL is logic low), both backgate diodes D6 and D4 are reversely biased as the tap node between P4 and P5—to which backgate BG3 is coupled—is tied to positive supply voltage level VSUP. The voltage on CSB2 and therefore the backgate voltage start to change due to a leakage current through diode D4. Backgate diode D3 of transistor P2 is initially zero biased (also D5) and the voltage on backgate BG1 remains unchanged.

Although the previously described low leakage switch achieves good performance, it is desirable to further improve the leakage currents, in particular for current or voltage reference stages.

SUMMARY

It is an object of the present invention to provide an electronic device for low leakage sampling with a better performance than prior art circuits.

According to an aspect of the invention, a low leakage switch is provided which comprises a first transistor, a second transistor and a third transistor. The first transistor is configured to receive an input voltage at a first side of its channel. The second transistor is configured to receive an input voltage at a first side of its channel. The second transistor is coupled with a second side of its channel to a backgate of the first transistor. The third transistor is configured to receive an input voltage at a first side of its channel. The third transistor is coupled with a second side of its channel to a backgate of the second transistor. The low leakage switch further comprises a pre-sampling transistor and a pre-sampling capacitor. The pre-sampling transistor is coupled with a first side of its channel to an input node and with a second side of its channel to the pre-sampling capacitor. The first transistor is coupled with the first side of its channel to the node connecting the second side of the channel of the pre-sampling transistor and the pre-sampling capacitor. A main sampling capacitor can then be coupled to the second side of the channel of the first transistor. Using a pre-sampling stage with a pre-sampling capacitor and a pre-sampling transistor allows adjusting the voltage level at the first side of the channel of the first transistor before the main sampling step is performed by the first transistor. This minimized leakage current.

Backgate voltage sampling capacitors may be coupled to the second sides of the channels the second transistor and/or third transistor. This provides that the backgate voltage levels are maintained and stabilized. Accordingly, the second side of the channel of the second transistor may be coupled to a first backgate voltage sampling capacitor. The second side of the channel of the third transistor may be coupled to a second backgate voltage sampling capacitor.

According to an aspect of the invention, the pre-sampled input voltage is not only fed to the first transistor (i.e. to the main sampling transistor), but also to other transistors which are used for biasing the backgate voltages. This further decreases voltage differences across the transistors and thereby decreases leakage currents. Accordingly, the first side of the channel of the second transistor can be coupled to the node connecting the second side of the channel of the pre-sampling transistor and the pre-sampling capacitor. Furthermore, the first side of the channel of the third transistor can be coupled to the node connecting the second side of the channel of the pre-sampling transistor and the pre-sampling capacitor.

In another aspect of the invention, the transistors may be switched in accordance with a specific switching scheme.

In one embodiment, the control gates of the pre-sampling transistor, the first transistor, the second transistor and the third transistor can be coupled to receive the same control signal. This means that all these transistors are switched synchronously.

In another embodiment, the control gate of the pre-sampling transistor can be coupled to receive a first control signal and a control gate of the first transistor can be coupled to receive a second control signal. The control gate of the first transistor can then be controlled by one control signal and the control gates of the second and third transistor can be controlled by a different control signal. Using two different control signals for at least the pre-sampling transistor and the first transistor is advantageous as the pre-sampling step can then be performed before the main sampling step is performed by the first transistor.

The electronic device can further be configured to activate the second transistor and third transistor for adjusting (biasing) the backgate voltage of the first transistor through the first control signal before activating the first transistor for sampling the input voltage on a main sampling capacitor through the second control signal. This provides that the influence of the backgate voltage of the first transistor is minimized as the voltage that is required for stabilizing and biasing the backgate voltage of the first transistor has more time to settle.

According to an aspect of the invention, a decoupling transistor may be provided. The decoupling transistor can be coupled with the first side of its channel to the node connecting the first backgate voltage sampling capacitor and the second side of the channel of the second transistor. The second side of the channel of the decoupling transistor can be coupled to the backgate of the first transistor. The control gate of the decoupling transistor can then be controlled with a third control signal. This aspect of the invention allows the backgate of the first transistor to be decoupled from the second side of the channel of the second transistor as long as the second and/or third transistors are activated (conducting) for sampling the input voltage on the first and second backgate voltage sampling capacitor.

The low leakage switch may further comprise a backgate voltage buffering capacitor being coupled with one side to the backgate of the first transistor and the second side of the decoupling transistor in order to buffer the voltage at the backgate of the first transistor as long as the decoupling transistor is turned off (not conducting). The decoupling transistor may be activated through the third control signal when the first control signal changes from inactive to active. Furthermore, the third control signal can be used to deactivate the decoupling transistor when the second control signal changes from inactive to active in order to activate the first transistor for sampling the input voltage on the main sampling capacitor. The decoupling transistor and the backgate voltage buffering capacitor further reduce the leakage currents. In particular, the backgate or bulk insulating configuration prevents noise or disturbances from propagating from the input node of the low leakage switch to the backgate or bulk of the first transistor.

Using the specific switching scheme provides that the voltages on the backgate voltage sampling capacitors and the pre-sampling capacitor have more time to settle. The requirements to any buffers used to drive the input voltage are reduced. The first side of the channel and the backgate (bulk) of the first transistor already have the same voltage level (input voltage level) which improves the settling behavior. Furthermore, the voltage error on the main sampling capacitor can be reduced as a larger capacitance value for the main sampling capacitor can be used.

In an embodiment of the invention, there might be a first, a second and/or a third differential amplifier. The differential amplifiers may be configured as non-inverting amplifiers. The first non-inverting amplifier may then be coupled with a non-inverting input to the second side of the channel of the first transistor (i.e. to the output node of the low leakage switch) and with an output to the first side of the channel of the first transistor. The second non-inverting amplifier may be coupled with a non-inverting input to the output node of the low leakage switch and with an output to the backgate of the second transistor. The third amplifier may be coupled with a non-inverting input to the output node of the low leakage switch and with an output to the backgate of the first transistor. This aspect of the invention is useful to stabilize the respective voltages at the source of the main sampling capacitor, the backgate of the main sampling capacitor and/or the backgate of the second transistor.

Using one or more amplifiers in accordance with the aspects of the invention is advantageous, as the advantages of a passive and an active switch architecture are combined. Once the amplifiers have settled, they reduce the leakage currents to their minimum. However, transient disturbances are mainly eliminated by the passive components of the low leakage switch if the amplifiers have not yet settled.

In an embodiment of the invention, the first, second and third differential amplifier may be implemented with a common input transistor. The control gate of the common input transistor may then serve as a non-inverting input for the first, second and third differential amplifier. This concept can advantageously be applied to many different concepts only one of which is a low leakage switch. If multiple nodes have to controlled to assume a common voltage level, the specific concept according to this aspect of the invention, in which the first, second and third differential amplifier are combined, provides the functionality of three amplifiers with one amplifier.

According to an aspect of the invention, an electronic device for providing a reference current and/or a reference voltage may be provided. The electronic device may comprise at least one switch that is implemented in accordance with the aspects of the invention. The electronic device may comprise a bandgap reference voltage stage, for buffering the bandgap voltage provided by the bandgap voltage stage and sampling stages for sampling the reference voltages provided by the bandgap voltage and the buffer. The sampling stages may then comprise switches. At least one of the switches may be implemented in accordance with the aspects of the invention. The bandgap voltage may then be configured to be switched off during a first period of time switched on during a second period of time and the buffer may be switched on during a third period of time and switched off during a second period of time. The third period of time may then be longer than the first period of time. This provides that the bandgap voltage stage is switched off earlier than the buffer which saves power. The output voltage of the bandgap voltage stage may be sampled on a sampling capacitor.

The electronic device may be configured to sample the output voltages of the bandgap reference voltage stage and the buffer in accordance with the minimum settling times of the respective stages. If the settling time of the bandgap reference voltage stage is shorter than the settling of the buffer, this can advantageously be used for reducing the on-time of the bandgap reference voltage stage.

Furthermore, a resistive divider may be provided and coupled to the output of the buffer. The resistive divider may then only be supplied with current when the buffer is active. This provides that the current consumption of the buffer and the resistive divider are switched off at the same time.

The invention also provides a method of operating the low leakage switch. Accordingly, a backgate voltage of a first transistor of the switch may be biased (or adjusted) through other transistors. The input voltage may be sampled by a pre-sampling stage comprising a pre-sampling transistor and a pre-sampling capacitor. The backgate voltage of the first transistor may be adjusted before the first transistor is activated. The other transistors may be activated in order to sample the input voltage on backgate voltage sampling capacitors.

In other words, the low leakage switch can comprise a cascade of transistors. The cascade of transistors has a first and a last transistor. In accordance with the previously described aspects of the invention, the cascade comprises the first transistor (main sampling transistor), the second transistor and the third transistor. The first, second and third transistor of the cascade are all coupled to receive at a first side of their channels (e. g. at a drain junction or source junction) an input voltage. In accordance with the embodiments and aspects of the invention, the first transistor may not directly be coupled to the input node. A pre-sampling stage including a pre-sampling transistor and a pre-sampling capacitor may be used to sample and hold the input voltage. This pre-sampled input voltage can then be supplied to the first side of the channel of the first transistor.

In the context of this invention, a side of a channel may refer to either the drain junction or the source junction of a transistor, in particular of a MOSFET. The transistors are preferably MOSFET transistors. The pre-sampling transistor, the second and third transistors and the first transistor of the cascade receive first and second control signals at their control gates, respectively. This provides that the first, second and third transistors are not switched simultaneously. The first transistor is coupled at a second side of its channel (source or drain junction) to a main sampling capacitor. Each subsequent transistor of the cascade (second and third transistor) is coupled with the second side of its channel to a backgate of a previous transistor. The last transistor of the cascade (i.e the third transistor in this embodiment) can be coupled at its backgate (backgate) to a supply voltage level (ground is also considered as a supply voltage level). Accordingly, the backgate diodes of the transistors (first, second, and third transistor) are configured as a chain or a series of backgate diodes. The last backgate diode can be coupled to a supply voltage level and the first backgate diode (e. g. the backgate diode of the first transistor) can be coupled to the main sampling capacitor. This provides that the process of discharging or charging the sampling capacitor is delayed. Therefore, the hold time can be extended substantially. Using a cascade of transistors according to aspects of the invention is efficient since the current through a reverse biased backgate diode depends exponentially on the voltage drop across the diode.

The transistors of the cascade can be of the same type (e. g. they are either PMOS or NMOS transistors). This provides that the backgate diodes lie towards reverse biasing rather than forward biasing.

According to aspects of the invention, the backgate voltage buffer capacitors may have a capacitance value that is smaller than the capacitance value of the main sampling capacitor. This relates to the cognition that the current through a reverse biased backgate diode exponentially depends on the voltage across the diode. According to this aspect of the invention, it is possible to substantially decrease the capacitance values and therefore the size of the sampling capacitors. Furthermore, the buffer capacitors which are coupled to the transistors of the cascade being closer to the last transistor can have smaller capacitance values than those earlier in the cascade, e. g. those which are closer to the first transistor (main sampling transistor).

BRIEF DESCRIPTION OF DRAWINGS

Further aspects and characteristics of the invention ensue from the following description of the preferred embodiments of the invention with reference to the accompanying drawings, wherein.

DETAILED DESCRIPTION OF EXAMPLE EMBODIMENTS

Figure 2:
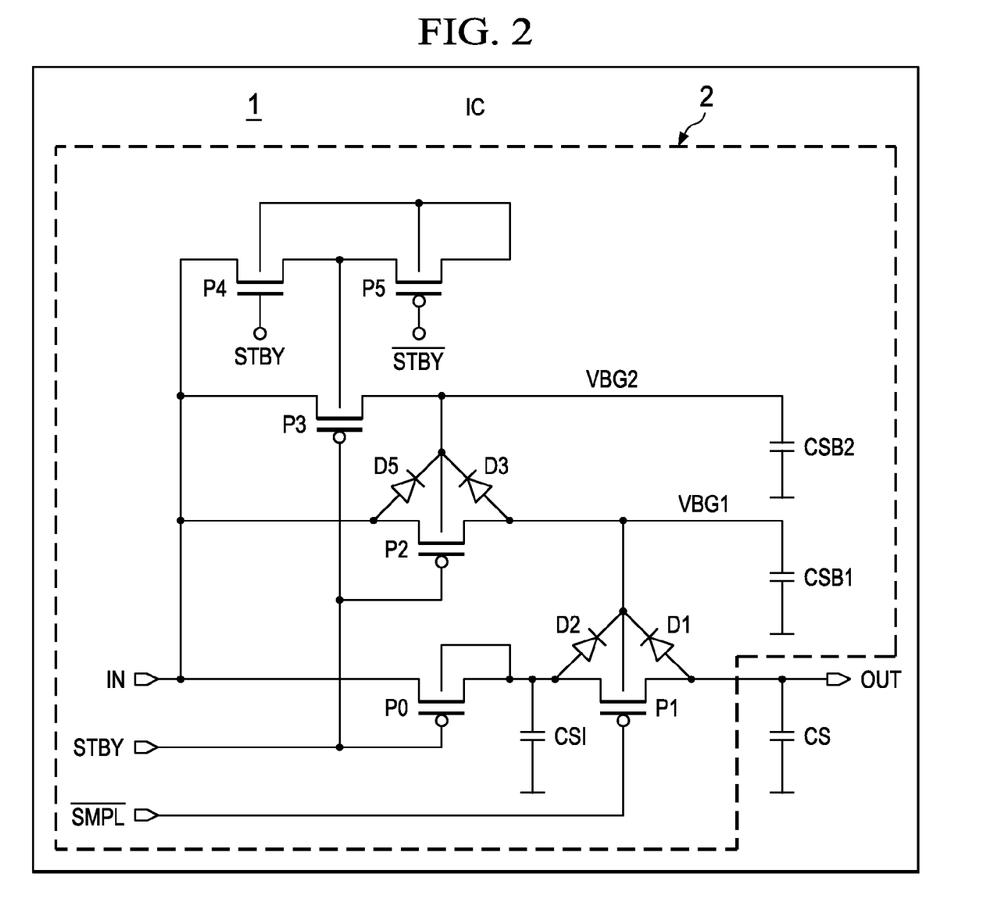
FIG. 2 shows a simplified circuit diagram of an electronic device according to an embodiment of the invention.

FIG. 2 shows a simplified circuit diagram of an embodiment of the invention. There is an integrated circuit (electronic device) 1 including a low leakage switch 2 according to aspects of the invention. The low leakage switch comprises a pre-sampling stage comprising PMOS transistor P0 and pre-sampling capacitor CSI. Pre-sampling transistor P0 is coupled with one side of its channel to the input node IN to which an input voltage can be coupled that is to be sampled through the switch. The second side of the channel of transistor P0 is coupled to the pre-sampling capacitor CSI. The control gate of transistor P0 is coupled to a first control signal STBY. One side of the pre-sampling capacitor CSI and the second side of the channel of transistor P0 are connected at one node. This node is coupled to the first side of the channel of the first transistor P1 which is the main sampling transistor in this embodiment. The control gate of the main sampling transistor P1 is controlled through a second control signal $\overline{\text{SMPL}}$. The second side of the channel of transistor P1 is coupled to the main sampling capacitor CS. The main sampling capacitor CS can also be external to the low leakage switch 2. The backgate of the main sampling transistor P1 is coupled to a first backgate voltage sampling capacitor CSB1 as well as to a second side of the channel of the second transistor P2. The first side of the channel of transistor P2 is also coupled to the input node IN, i.e. to the first side of the channel of the pre-sampling transistor P0. The control gate of the second transistor P2 is coupled to the first control signal STBY. The backgate of the second transistor P2 is coupled to a second backgate voltage sampling capacitor CSB2 and to a second side of a third transistor P3. The first side of the channel of the third transistor P3 is also coupled to the input node IN. The control gate is coupled to the first control signal STBY. The backgate of transistor P0 is coupled to the source of transistor P0. The voltage level at the backgate of transistor P1 is VBG1 (reference is also used as node VBG1). The voltage at the backgate of transistor P2 is VBG2 (reference is also used as node VBG2). The input voltage at input node IN is sampled through transistors P3, P2 and P0 on capacitors CSB2, CSB1 and CSI respectively. This provides that the voltages levels VBG1 and VBG2 are basically similar to the input voltage. This prevents leakage currents through diodes D1, D2, D3 and D5 which are the parasitic backgate diodes of the respective transistors.

Furthermore, also the backgate of the third transistor P3 may be biased. Transistor P5 is coupled with the first side of its channel to the backgate of the third transistor. The second side of the channel of P5 is coupled to its backgate and to the backgate of transistor P4. The first side of the channel of transistor P4 is coupled to the input node IN. The second side of the channel of transistor P4 is coupled to the backgate of the third transistor P3. The control gate of transistor P5 is coupled to the inverted first control signal $\overline{\text{STBY}}$. The control gate of transistor P4 is coupled to the non-inverted first control signal STBY.

Figure 3:
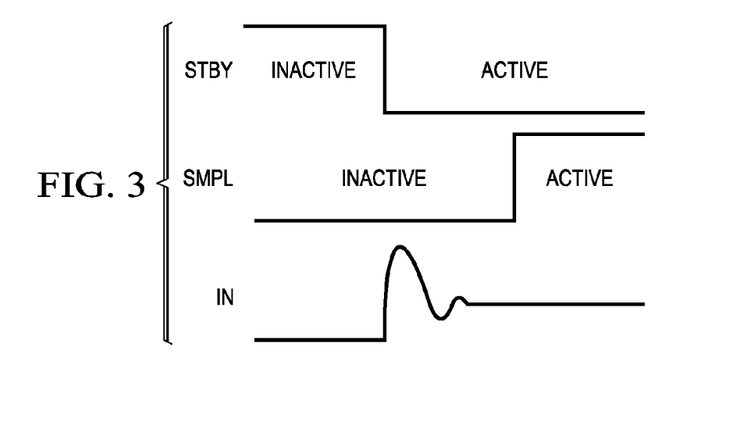
FIG. 3 shows signals relating to the embodiment shown in FIG. 2.

FIG. 3 shows signals relating to the embodiment shown in FIG. 2. There are the first control signal STBY and the second control signal SMPL as well as the voltage level at the input node IN. As long as signal STBY is high, the respective transistors P0, P2 and P3 are inactive (not conducting). If the first control signal STBY switches from high to low the transistors P0, P2 and P3 are activated which means that the channels of the respective transistors become conducting. The second control signal SMPL is used as inverted signal $\overline{\text{SMPL}}$. This means that the main sampling transistor P1 is inactive as long as SMPL is low and becomes active (conducting) when signal SMPL changes from low to high. Transistors P2 and P3 are mainly responsible for biasing the backgate voltage VBG1 at the backgate of main sampling transistor P1. Transistors P2 and P3 are activated before the input voltage is sampled through main sampling transistor P1 on main sampling capacitor CS. This means that the input voltage has more time to settle before it is sampled.

Figure 4:
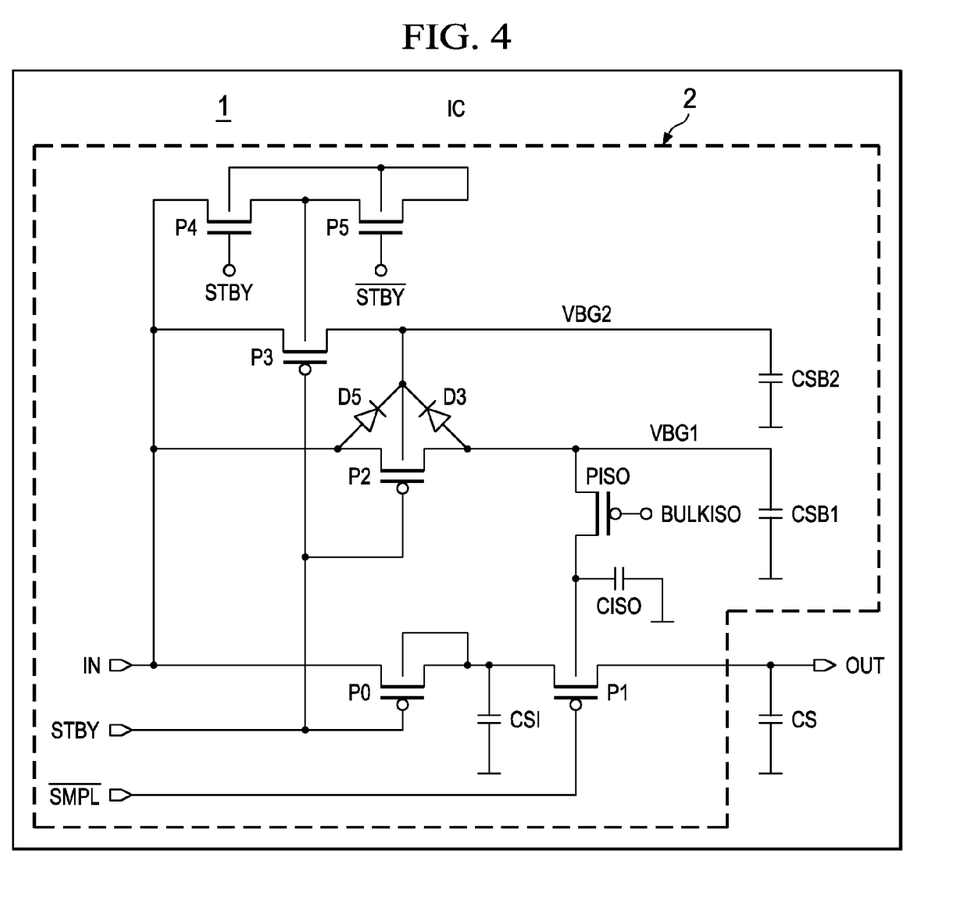
FIG. 4 shows a simplified circuit diagram of another embodiment of the invention.

FIG. 4 shows a simplified circuit diagram of another embodiment of the invention. Most components and the signals shown in the embodiment of FIG. 4 are similar to those of FIG. 2. However, in addition to the components of the embodiment of FIG. 2, there is an additional decoupling transistor PISO, which is coupled with its channel between node VBG1 and the backgate of the main sampling transistor P1. Furthermore, there is a backgate voltage sampling capacitor CISO, which is coupled between the backgate of main sampling transistor P1 and ground. The control gate of transistor PISO is controlled through a third control signal BULKISO.

Figure 5:
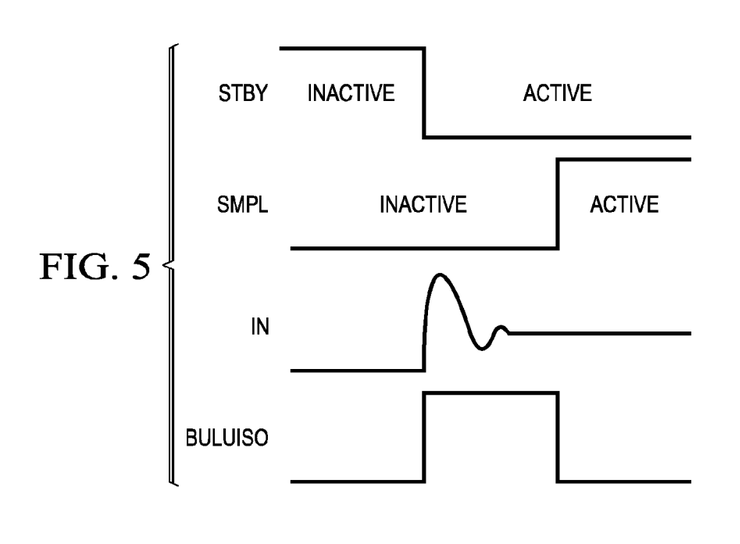
FIG. 5 shows signals relating to the embodiment shown in FIG. 4.

FIG. 5 shows signals relating to the embodiment shown in FIG. 4. As long as the first control signal STBY is active and the second control SMPL is inactive the signal BULKISO is high thereby turning transistor PISO off. This means that the backgate of the main sampling transistor P1 is decoupled from node VBG1. The capacitor CISO preserves the backgate voltage that has previously been reached at the backgate of P1 for a certain time. The voltage drop between the backgate of P1 and the drain and source of P1 is minimized which reduces any leakage current. Furthermore, any disturbances or noise from the input node cannot propagate to the backgate of the first transistor.

Figure 6:
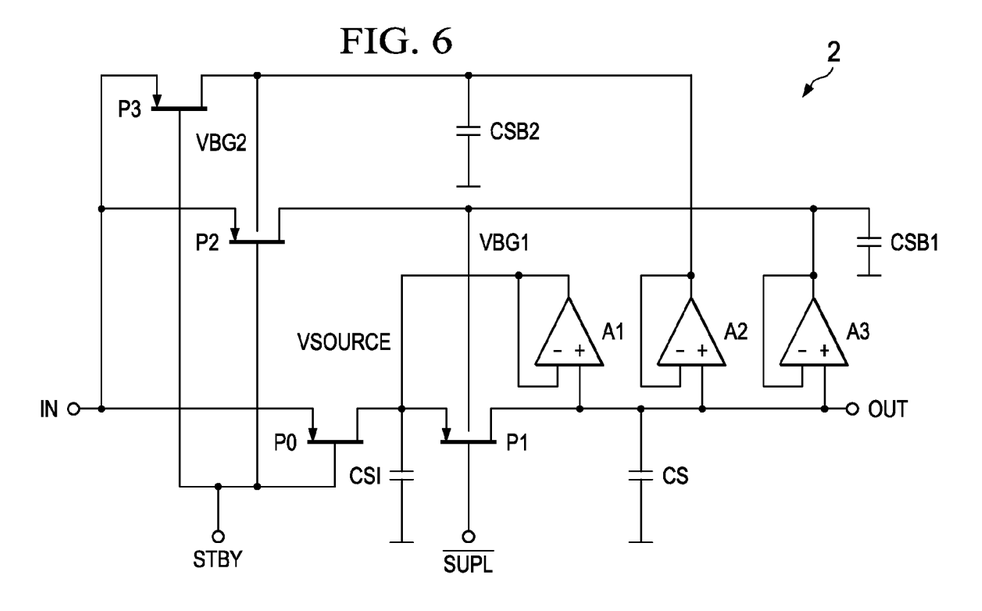
FIG. 6 shows a simplified circuit diagram of another embodiment of the invention.

FIG. 6 shows a simplified circuit diagram of another embodiment of the invention. Most of the components are similar to the embodiment shown in FIG. 2 and FIG. 4. However, in addition to the components of the previous embodiments, there are three non-inverting amplifiers A1, A2 and A3 for further buffering the voltage levels VSOURCE, VBG1 and VBG2. The positive input of amplifier A1 is coupled to the output node OUT of the low leakage switch. The output of the non-inverting amplifier A1 is coupled to the source of main sampling switch P1 and provides that the voltage level VSOURCE at the source of P1 is equal to the voltage level at the output node OUT. The second non-inverting amplifier A2 is coupled with its non-inverting input to output node OUT and with its output to the backgate node VBG2 of the transistor P2. Furthermore, the non-inverting amplifier A3 is coupled its non-inverting input to the output node OUT and with its output to the backgate node VBG1 of the main sampling transistor P1. Similar to non-inverting amplifier A1, the non-inverting amplifiers A2 and A3 also provide that the voltage levels at nodes VBG1 and VBG2 are similar to the voltage level at the output node OUT.

Figure 7:
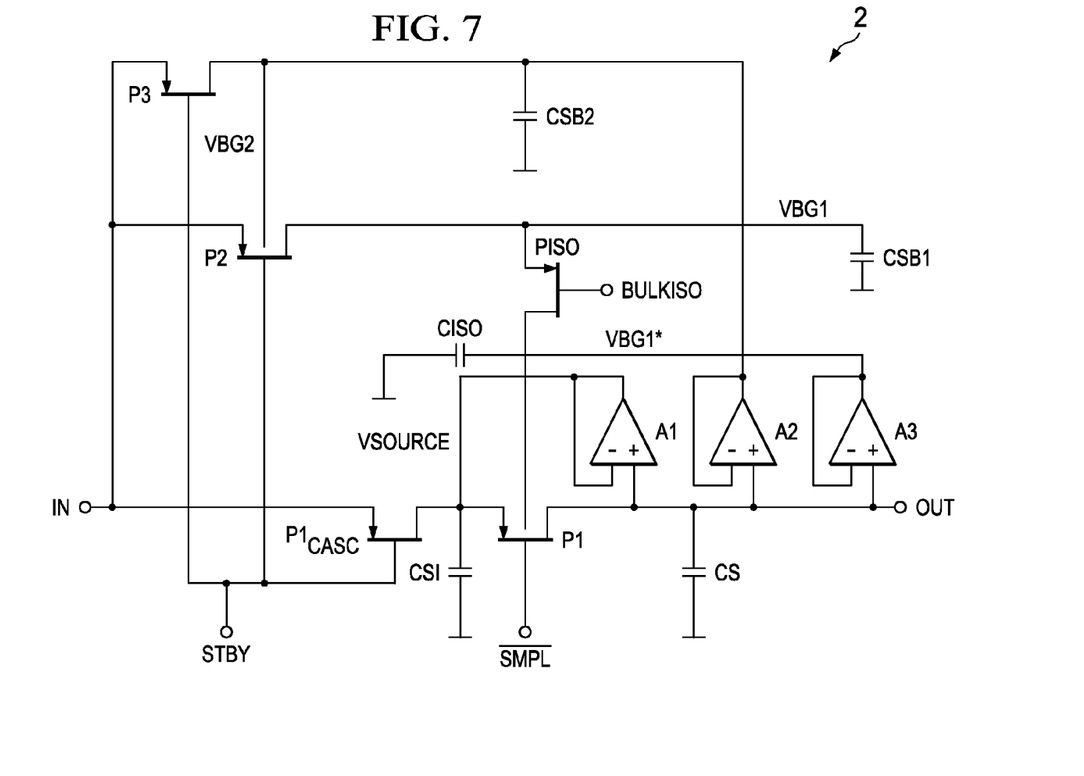
FIG. 7 shows a simplified diagram of still another embodiment of the invention.

FIG. 7 shows another embodiment of the invention, which is basically a combination of the embodiments shown in FIG. 4 and FIG. 6. Similar to the embodiment shown in FIG. 4, there is transistor PISO, which is coupled between node VBG1 and node VBG1* which is the backgate of main sampling transistor P1. Furthermore, there is capacitor CISO for buffering the voltage level at node VBG1*, i.e. at the backgate of main sampling transistor P1. The amplifiers A1, A2 and A3 are arranged as previously described.

Figure 8:
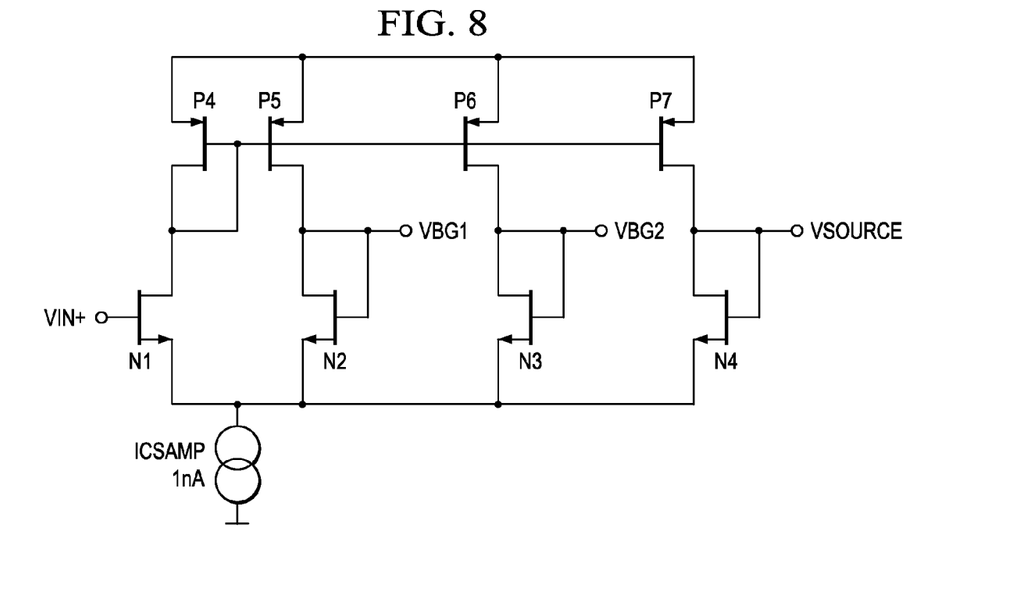
FIG. 8 shows a simplified circuit diagram of an embodiment of amplifiers that can be used for the embodiment shown in FIG. 6 and FIG. 7.

FIG. 8 shows a circuit diagram of an embodiment of amplifiers A1, A2 and A3. The shown embodiment of an amplifier can advantageously be applied to applications, where multiple nodes have to be controlled to assume the same or similar voltage levels. Accordingly, there is an input current path comprising transistor P4 and transistor N1. Transistor N1 provides at its control gate the positive (non-inverting) input for all three amplifiers A1, A2 and A3 as shown in the embodiments of the main switch. The respective output signals are provided between transistors P5, N2, transistors P6 N3 and transistors P7, N4. The control gates of P5, P6 and P7 are all coupled to the control gate of transistor P4 which is a diode-coupled PMOS transistor. The NMOS transistors N2, N3 and N4 are also diode-coupled transistors having their control gates coupled to the respective drains and providing thereby respective signals VBG1, VBG2 and VSOURCE as shown in FIG. 6 and FIG. 7. The bias current source ICSANP may operate with only 1 nA of biasing current. This architecture consumes only very little current and is still able to perform as required in the previously described embodiments.

Figure 9:
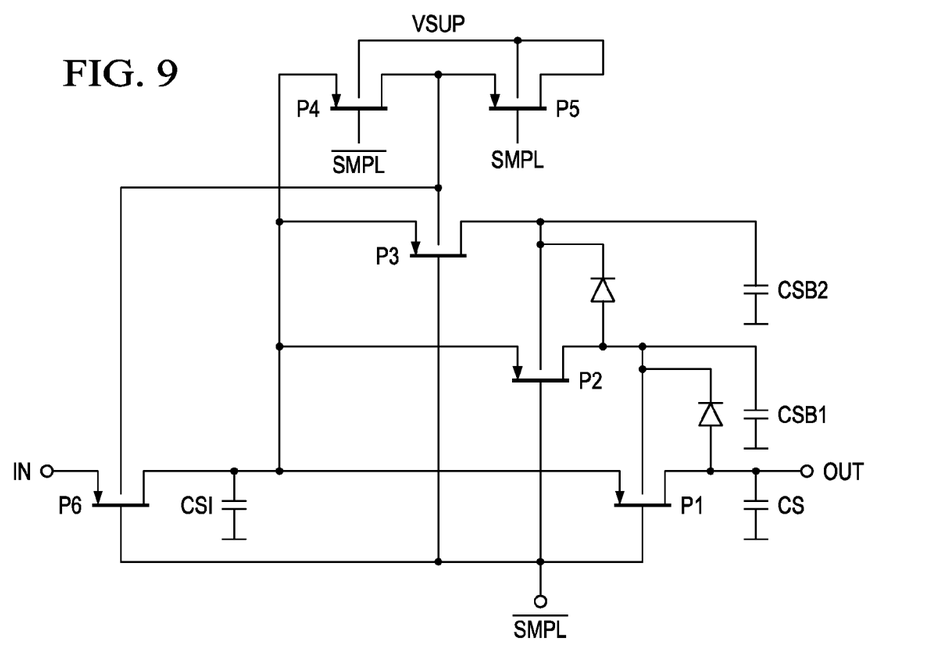
FIG. 9 shows a simplified circuit diagram of an electronic device according to an embodiment of the invention.

FIG. 9 shows a simplified circuit diagram of a low leakage switch according to another embodiment of the invention. Only single control signal is used for all transistors. In particular, the non-inverted control signal SMPL is used for switching transistor P5 and the inverted control signal $\overline{SMPL}$ is used for transistors P6, P1, P2, P3 and P4. The main difference with respect to the previously described embodiments is that the pre-sampling stage comprising P6 and CSI is now coupled to the first sides of the channels of the first transistor P1, the second transistor P2 and the third transistor P3. This means that the first side of the channel of the first transistor P1, the first side of the channel of the second transistor P2, the first side of the channel of the third transistor P3, and the first side of the channel of the fourth transistor P4 are all connected to the output node of the pre-sampling stage. The output node of the pre-sampling stage is the node to which the second side of the pre-sampling transistor P6 and one side of the pre-sampling capacitor CSI are connected. The other side of CSI is coupled to ground. The first side of the channel of the pre-sampling transistor P6 is coupled to the input node IN. Furthermore, the backgate of the pre-sampling transistor P6 is coupled to the backgate of the third transistor P3.

Figure 10:
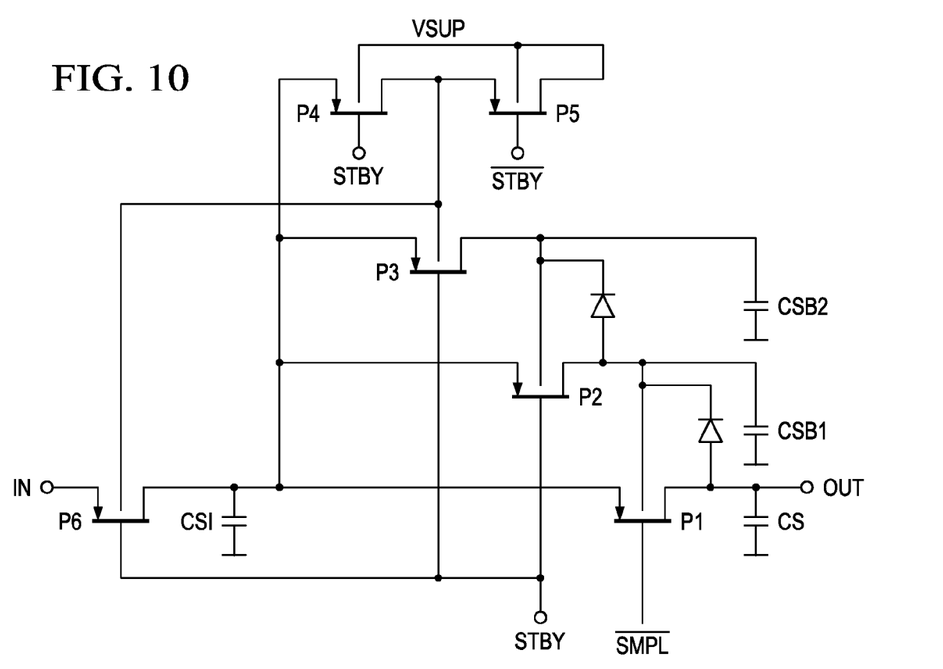
FIG. 10 shows a simplified circuit diagram of an electronic device according to an embodiment of the invention.

FIG. 10 shows a simplified circuit diagram of a low leakage switch according to another embodiment of the invention. This embodiment uses two control signals. A first control signal STBY for the pre-sampling transistor P6, the second transistor P2 and the third transistor P3. A second control signal $\overline{SMPL}$ is used for the first transistor P1. Transistors P4 and P5 are switched with STBY and its inverted version. The pre-sampling stage comprising P6 and CSI is coupled to the first sides of the channels of the first transistor P1, the second transistor P2 and the third transistor P3. Similar to the embodiment shown in FIG. 9, the first side of the channel of the first transistor P1, the first side of the channel of the second transistor P2, the first side of the channel of the third transistor P3, and the first side of the channel of the fourth transistor P4 are all connected to the output node of the pre-sampling stage. The output node of the pre-sampling stage is the node to which the second side of the pre-sampling transistor P6 and one side of the pre-sampling capacitor CSI are connected. The other side of CSI is coupled to ground. The first side of the channel of the pre-sampling transistor P6 is coupled to the input node IN. Furthermore, the backgate of the pre-sampling transistor P6 is coupled to the backgate of the third transistor P3.

Figure 11:
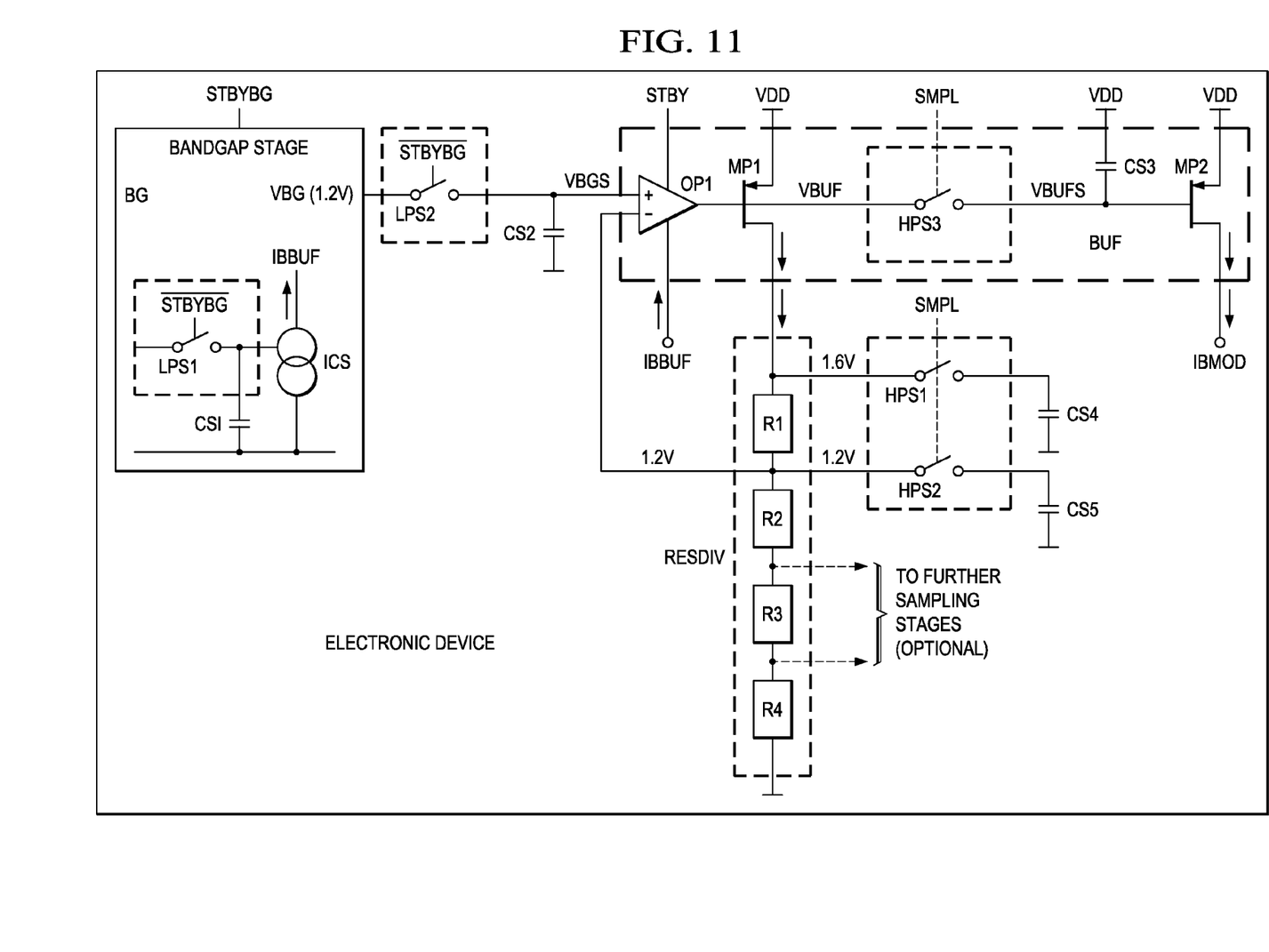
FIG. 11 shows a simplified circuit diagram of an embodiment of the invention.

FIG. 11 shows a simplified circuit diagram of an embodiment of the invention. There is a bandgap reference voltage stage BG including a bias current generator represented by a current source ICS, a sampling capacitor CS1 and a low performance switch LPS1. The bandgap reference voltage stage can be implemented according to embodiments known to those skilled in the art. The reference bandgap voltage stage provides a bandgap voltage VBG of for example 1.2 V. There is further a buffer comprising operational amplifier OP1, PMOS transistor MP1, switch HPS3, sampling capacitor CS3 and PMOS transistor MP2. Furthermore, there is a resistive divider comprising resistors R1, R2, R3 and R4. The bandgap voltage VBG is sampled by a first sampling stage comprising sampling capacitor CS2 and switch LPS2. Switch LPS2 is coupled between the output of the bandgap voltage stage BG and one side of sampling capacitor CS2. The other side of the sampling capacitor CS2 is coupled to ground. The bandgap voltage VPG is sampled on sampling capacitor CS2 as sampled bandgap voltage VBGS. This sampled voltage VBGS is then fed to the positive input of operational amplifier OP1 of buffer BUF. Operational amplifier OP1 is activated and deactivated through signal STBY. Furthermore, operational amplifier OP1 receives a biasing current IBBUF. The output of operational amplifier OP1 is fed to the control gate of PMOS transistor MP1. The source of PMOS transistor MP1 is coupled to a supply voltage level (for example VDD). The drain of PMOS transistor MP1 is coupled to one side of resistive voltage divider RESDIV. Resistive divider RESDIV basically comprises a series of resistors R1, R2, R3 and R4. The output of operational amplifier OP1 is also coupled to switch HPS3. Switch HPS3 is controlled through signal SMPL. Switch HPS3 serves to sample the output voltage of operational amplifier OP1 on sampling capacitor CS3 which is coupled with one side to switch HPS3 and with the other side to a supply voltage level (VDD in this example). The sampled output voltage of operational amplifier OP1 is VBUFS and this voltage is fed to the control gate of PMOS transistor MP2. The source of PMOS transistor MP2 is coupled to supply voltage level VDD in this example. The drain of PMOS transistor MP2 provides a bias current IBMOD. The voltages provided by resistive divider RESDIV are also sampled on sampling capacitors CS3, CS4 and optionally on further capacitors not shown in this example. The voltage on the node between resistor R1 and the drain of PMOS transistor MP1 is sampled on sampling capacitor CS3 through switch HPS1. Switch HPS1 is controlled by signal SMPL. The voltage level on the node between resistors R1 and R2 is sampled on sampling capacitor CS4 through switch HPS2. Switch HPS2 is controlled by signal SMPL. The voltage level at the node between resistors R1 and R2 is also coupled to the negative input of operational amplifier OP1 of the buffer BUF.

Switches HPS1, HPS2 and HPS3 are advantageously high performance switches. They may be implemented as previously described with respect to FIG. 1 to FIG. 10. Switches LPS1 and LPS2 can have lower performance and be implemented in simpler manner than switches HPS1, HPS2 and HPS3. Switches LPS1 and LPS2 may be implemented as simple transmission gates, as the required hold time is much lower than for the high performance switches.

Figure 12:
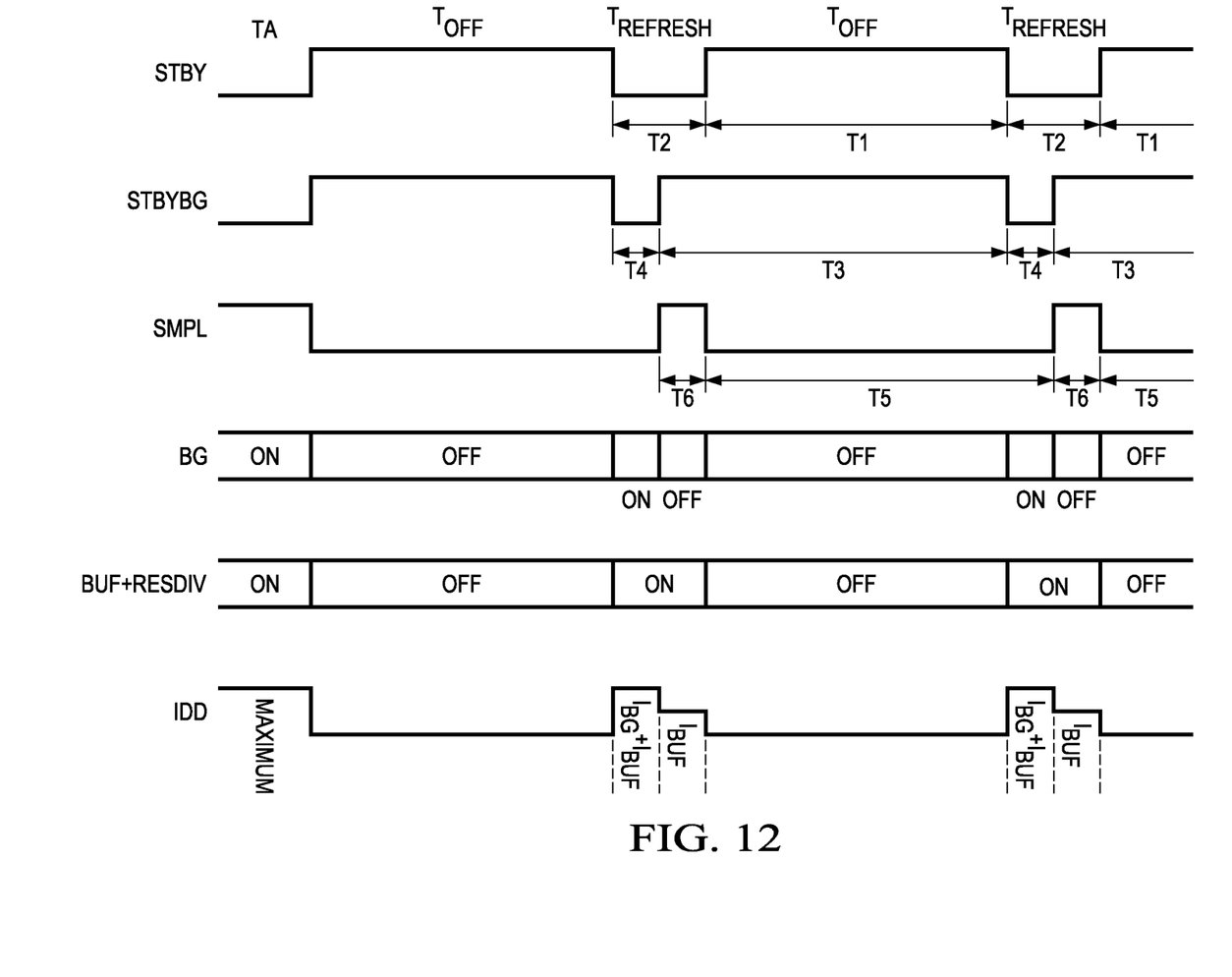
FIG. 12 shows signals of a switching scheme for the embodiment shown in FIG. 11.

The switching scheme used for switching switches LPS1, LPS2, HPS1, HPS2 and HPS3 is now further described with respect to FIG. 12. Furthermore, FIG. 12 also shows the activation scheme of the different stages as for example bandgap reference voltage stage BG and operational amplifier OP1.

FIG. 12 shows various signals and the activation states of the stages shown in the embodiment of FIG. 11. There is signal STBY, signal STBYBG, as well as signal SMPL. The activation state of the bandgap reference voltage is indicated by BG while the activation state of buffer BUF and resistive divider RESDIV is indicated by BUF+RESDIV. The overall current consumption is indicated by IDD. There are generally three different cycles, an activation phase TA (also referred to as active mode phase), a refresh phase and an OFF-phase. During the active mode phase, signal STBY is low, signal SMPL is high and signal STBYBG is low. This means that the electronic device according to the embodiment of the invention shown in FIG. 9 consumes maximum power IDD. After the active mode phase, the switched mode operation of the electronic device shown in FIG. 9 begins with the OFF-phase TOFF. Accordingly, during the OFF-phase, signal STBY is high, signal SMPL is low and signal STBYBG is high. This provides that switches LPS1, LPS2, HPS1, HPS2 and HPS3 are disconnecting and that the respective sampled voltage on capacitors CS3, CS4 and CS5 (also on CS1 and CS2) are preserved. Furthermore, the operational amplifier OP1 and the bandgap voltage reference stage BG are deactivated and consume minimum power.

After the OFF-phase having a duration of TOFF, the voltages sampled on the capacitors CS3, CS4 and CS5 have to be refreshed. Therefore, the OFF-phase is followed by a refresh phase of a period TREFRESH that is equal to T2.

The first control signal STBY is low during a period T2 i.e. during the whole refresh cycle. The second control signal SMPL is high during period T6 that is shorter than the period T2 of the first control signal STBY. The first control signal STBY is then high during the period T1 for switching the buffer and their resistive divider off.

The control STBYBG is low during a period T4, i.e. during the first half of the refresh cycle and changes from low to high when the second control signal SMPL changes from low to high. Signal STBYBG remains high during a period T3, which starts already within the refresh phase (about half the refresh phase) and remains high for the remainder of the refresh phase and the next OFF-period. Period T3 is therefore longer than period T1. During period T4 (within the refresh cycle) maximum current is consumed as the bandgap voltage reference stage BG and the buffer as well as the resistive divider consume current. However, when STBYBG switches from low to high within the refresh phase (at about the middle of the refresh phase), the bandgap reference voltage source BG is switched off and only the buffer BUF consumes power.

This reduces the overall power consumption during the refresh cycle compared with solutions where all stages remain on during the entire refresh phase. The total current IDDtot may be calculated as:

IDDtot=(((IBG/2+IBUF)*(TREFRESH/(TREFRESH+TOFF))), wherein IBG is the current consumed by the bandgap reference voltage stage, and IBUF is the current consumed by the buffer BUF and resistive divider RESDIV if these stages are all active. Compared with the conventional solution, where IDDtot=(((IBG+IBUF)*(TREFRESH/(TREFRESH+TOFF))), this is a reduction of almost 25%.

At the end of the refresh phase, the second control signal SMPL changes from high to low and remains low over the total subsequent OFF-phase and even when the next refresh cycle begins. The second control signal SMPL only changes from low to high at about the middle of the next refresh phase. This means that period T5 is longer than period T1.

It is apparent from FIG. 12 that signals STBY and SMPL can serve as first and second control signals for the low leakage switches 2 of the embodiments of the invention.

Although the invention has been described hereinabove with reference to specific embodiments, it is not limited to these embodiments and no doubt further alternatives will occur to the skilled person that lie within the scope of the invention as claimed.

The invention claimed is:

1. A low leakage switch comprising a first transistor being configured to receive an input voltage at a first side of its channel, a second transistor being configured to receive an input voltage at a first side of its channel and coupled with a second side of its channel to a backgate of the first transistor and a third transistor being configured to receive an input voltage at a first side of its channel and coupled with a second side of its channel to a backgate of the second transistor, wherein the low leakage switch further comprises a pre-sampling transistor and a pre-sampling capacitor and wherein the pre-sampling transistor is coupled with a first side of its channel to an input node, with a second side of its channel to the pre-sampling capacitor, and the first transistor is coupled with the first side of its channel to the second side of the channel of the pre-sampling transistor and to the pre-sampling capacitor;

wherein a control gate of the pre-sampling transistor is coupled to receive a first control signal and a control gate of the first transistor is coupled to receive a second control signal; and wherein control gates of the second transistor and the third transistor are coupled to receive the first control signal.

2. The low leakage switch of claim 1, being further configured to activate the second transistor for adjusting the backgate voltage of the first transistor through the first control signal before activating the first transistor through the second control signal.

* * * * *